Nov. 8, 1960 W. W. GAERTNER 2,959,502

FABRICATION OF SEMICONDUCTOR DEVICES

Filed Sept. 1, 1959

INVENTOR,
WOLFGANG W. GAERTNER

BY Harry M. Saragovitz

ATTORNEY.

2,959,502
Patented Nov. 8, 1960

2,959,502

FABRICATION OF SEMICONDUCTOR DEVICES

Wolfgang W. Gaertner, Allenhurst, N.J., assignor to the United States of America as represented by the Secretary of the Army Filed Sept. 1, 1959, Ser. No. 837,560

7 Claims. (Cl. 148—1.5)

(Granted under Title 35, U.S. Code (1952), sec. 266)

The invention described herein may be manufactured and used by or for the Government for governmental purposes without the payment of any royalty thereon.

The present invention relates to methods of making semiconductor devices. More particularly, it relates to methods of mass-producing semiconductor devices in the form of junction rectifiers and transistors by printing electrodes on semiconductor wafers.

The techniques of making semiconductor devices by alloying and diffusing an impurity of one conductivity type into a semiconductor material of an opposite conductivity type are well known in the art. However, such devices involve certain manufacturing problems which not only make their construction complicated and expensive but introduce difficulties in maintaining uniformity in the product when the units are fabricated on a mass production basis. Indium, for example, is an acceptor, or P-type impurity in semiconductors, and may be introduced into N-type semiconductors so as to form a rectifying P-N junction therein. If uniformity of results is to be obtained in the manufacture of semiconductor devices on a sufficiently large scale, it is important to control the size, shape and position of the P-N junction made by such combined alloying and diffusing of the P-type impurity, indium, into the semiconductor showing N-type conductivity. The simple application of a small piece of indium material on the surface of a semiconductor, and the subsequent heating to produce alloying and diffusion produces a P-N junction whose size, shape and position varies from unit to unit, and whose location on the surface may be somewhat indeterminate. The indium tends to spread when melted and the area of the semiconductor finally coated is not the original area that was sought to be alloyed.

It is, therefore, a general object of the present invention to provide a method of making a semiconductor unit having a P-N junction of desired predetermined size, shape and position that may be produced on a mass-production basis.

Another object of this invention is to provide a process of diffusing a P-type conductivity impurity into an N-type conductivity semiconductor material whereby the size, shape and position of a P-N junction formed may be controlled.

A further object of the present invention is to provide a method of diffusing an impurity of one conductivity type into a semiconductor material exhibiting an opposite type conductivity by employing a binder mixed with the impurity and printed on the semiconductor material to control the wetting of the semiconductor by the impurity.

Another object of the present invention is to provide a method whereby indium may be diffused into silicon of N-type conductivity in order to produce P-N junctions of desired size, shape and position.

According to the present invention these and other objects and advantages are attained by an improved process wherein a semiconductor material is printed with a thin layer of a special composition, prepared from an impurity metal of the desired conductivity type and a binder which does not subsequently affect the P-N junction of the semiconductor device formed. The printed area may be accurately controlled in size, shape and position by the customary techniques well known in the printing art.

In one embodiment of the invention a composition composed of a P-type impurity, indium powder, and a binder is printed on the etched surface of an N-type silicon wafer as small dots which are separated from each other by definite predetermined spacing. The assembly is heated leaving film-like dots of pure indium on the silicon surface. With further heating, diffusion and alloying of the indium into the silicon takes place, forming multiple P-N junctions with well defined areas. The wafer is then cut into dice, each of which constitutes a complete structure having an alloyed P-N junction therein. Very satisfactory semiconductor devices in the form of junction rectifiers and transistors have been made by this method, using a binder composed of nitro cellulose and amyl acetate on silicon which is easily wetted by the impurity to be alloyed therein to form the P-N junction.

For a more detailed description of the invention, together with other and further objects thereof, reference is had to the following description taken in connection with the accompanying drawing, in which similar numerals designate similar elements, and wherein.

Figure 3:
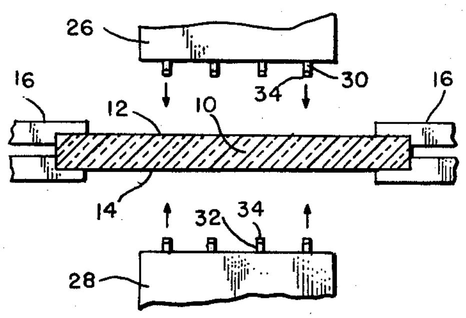
Fig. 3 is a view resembling Fig. 1 illustrating another step in the method of manufacture.
Figure 4A:
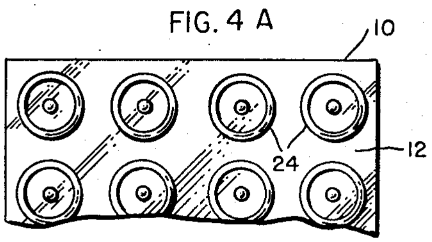
Figure 4B:
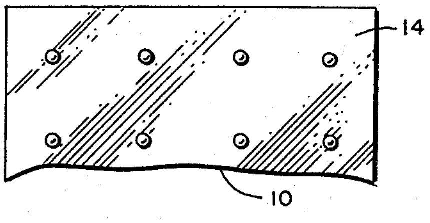
Figure 5:
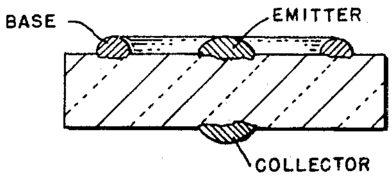

Figs. 4A and 4B, respectively, show partial top and bottom views of the wafer of Fig. 3 after the step shown in Fig. 3 has been applied; and Fig. 5 is a sectional view of a completed device according to the principles of the invention.

Figure 1:
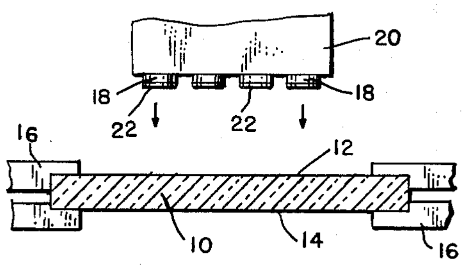
Fig. 1 illustrates the first step in accordance with the invention, with a semiconductor wafer being shown in a sectional view.
Figure 2:
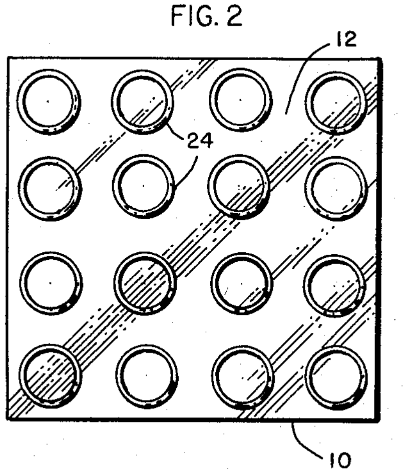
Fig. 2 is a top view of the wafer of Fig. 1 after the first step has been applied.

The method of the present invention will be described in connection with the manufacture of a junction transistor. Referring to Fig. 1, there is shown a wafer or crystal 10 of semiconductor material in the form of a thin disk having a pair of surfaces 12 and 14. Wafer 10, which for purposes of explanation herein, is considered to be N-type silicon, and has been cut from a single crystal and ground to a thickness of approximately .003″. However, wafer 10 may be germanium or the like. Wafer 10 having been etched by conventional methods well known in the art, is suitably mounted in a level horizontal position by a clamping arrangement 16. Such devices are well known in the art and since they do not constitute a part of the present invention, will not be described herein. The rubber surface 18 of a printing stamp 20 mounted above wafer 10 is coated with a composition 22 and imprints a multiple number of small rings 24, each separated by predetermined spacing, on surface 12 of wafer 10, as shown in Fig. 2. Composition 22 comprises a portion of finely divided metal flake, conveniently gold, mixed with equal amounts by weight of a binder consisting of 10 grams nitro cellulose dissolved in 400 cubic centimeters amyl acetate. Besides gold, particularly satisfactory results have been obtained with finely divided silver or nickel. Imprinted wafer 10 is placed in a furnace and the whole heated to about 1000° C. for about 10 minutes in an argon atmosphere. Before this heat is reached, the temporary binder evaporates leaving the rings 24 as gold integuments which with further heating alloys into wafer 10 to form ohmic contacts. Wafer 10 is now etched on both sides, washed and dried.

Since P-N junctions are desired on both sides of wafer 10 for a transistor, the wafer is re-mounted in clamping arrangement 16, and a pair of printing stamps 26 and 28, having rubber printing surfaces 30 and 32, respectively, are aligned with respective surfaces 12 and 14 of wafer 10. Surfaces 30 and 32 are coated with a composition 34 which comprises equal amounts by weight of the binder mentioned above and indium powder obtained by filing indium sheets. Stamps 26 and 28 are aligned to print, simultaneously, a multiple number of small dots symmetrically opposite each other on surfaces 12 and 14, respectively, of wafer 10, as shown in Figs. 4A and 4B. Each dot printed on surface 12 is concentric with each ring 24, as shown in Fig. 4A. The wafer 10 is again fired under an argon atmosphere to 500° C. for about 2 minutes. In the firing step the binder evaporates and pure indium is alloyed into wafer 10. Wafer 10 is then re-etched and cut by known methods into dice each of which constitutes a complete transistor. As shown in Fig. 5 each complete transistor comprises an emitter electrode and a base electrode on one surface of the semiconductor wafer, the base electrode being in the form of a ring spaced from the peripheral edges of the emitter, and the collector being on the opposite surface of the wafer.

If the wafer 10 comprises N-type semiconductor material such as silicon or germanium, then any one of indium, gallium, aluminum or boron, for example, may be used as the impurity material. If the semiconductor wafer is of P-type material, then any one of phosphorus, arsenic or antimony, for example, may be used as the impurity material.

It is readily seen from the above-described process that if a semiconductor device containing only one rectifying barrier is desired, as for example, a junction rectifier, the indium impurity is imprinted and alloyed on only one side of the silicon wafer 10.

It is also obvious that this method may be used to print on to the semiconductor wafer an entire circuit consisting of several transistors and diodes connected by resistances and capacitances.

Thus it is seen that there has been provided simple mass-production methods of forming P-N junctions in semiconductor materials of one conductivity by the alloying and diffusion of impurities of an opposite type therein. P-N junctions with controlled characteristics have been made by the diffusion of a P-type conductivity impurity, indium, with a binder printed on N-type conductivity silicon. The binder is chosen so that the silicon may be more easily wetted by the impurity, and still not contaminate the silicon. The size, shape and position of the P-N junctions are controlled by the printing process so that only an extremely thin amount of impurity is deposited on the silicon wafer, thereby preventing the silicon from cracking in the ensuing alloying process and providing a well defined, predetermined alloyed area on the silicon.

While the process in accordance with the present invention has been shown and described in connection with the fabrication of a junction transistor for the purpose of illustration, it will be obvious to those skilled in the art that various changes and modifications may be made therein without departing from the invention, and it is therefore aimed in the appended claims to cover all such changes and modifications as fall within the true spirit and scope of the invention.

What is claimed is:

1. The process of mass-producing semiconductor devices to introduce a P-N juinction therein comprising etching a wafer of semiconductor material of a first conductivity type, printing a composition upon the surface of said semiconductor wafer as a plurailty of dots each separated by predetermined spacing, which composition comprises a portion of impurity of the opposite conductivity type mixed with equal amounts by weight of a binder consisting of 10 grams nitro cellulose dissolved in 400 cubic centimeters amyl acetate, heating said wafer and said composition at about 500° C. for about 2 minutes, thereby to form a plurality of P-N junctions within said wafer, re-etching the surface of said wafer containing said junctions, and cutting said wafer into dice each of which contains a P-N junction.

2. The process of mass-producing semiconductor devices as defined in claim 1 wherein said semiconductor material comprises N-type conductivity silicon and said impurity comprises indium.

3. The process of mass-producing semiconductor devices as defined in claim 1 wherein said semiconductor material comprises P-type conductivity germanium and said impurity comprises arsenic.

4. The process of mass-producing semiconductor devices comprising etching a wafer of semiconductor material of a first conductivity type, printing a first composition upon a first surface of said wafer as a plurality of rings each separated by predetermined spacing, which first composition comprises a portion of finely divided metal flake mixed with equal amounts by weight of a binder consisting of 10 grams nitro cellulose dissolved in 400 cubic centimeters amyl acetate, heating said wafer and said first composition at about 1000° C. for about 10 minutes in an atmosphere of argon, thereby to form an ohmic contact with said wafer, etching both sides of said wafer, applying simultaneously a second composition to both sides of said wafer as a plurality of dots symmetrically opposite each other, each of said dots on said first surface being concentric with each of said rings and spaced therefrom, which second composition comprises a portion of impurity of the opposite conductivity type mixed with equal amounts by weight of said binder, heating said wafer and said second composition at about 500° C. for about 2 minutes in an atmosphere of argon, thereby to form P-N rectifying junctions within said wafer, re-etching both sides of said wafer, and cutting said wafer into dice to form discrete transistors each of which contains a P-N junction on opposite surfaces and an ohmic contact on one of said surfaces surrounding one of said junctions and spaced therefrom.

5. The process of mass-producing semiconductor devices as defined in claim 4 wherein said semiconductor material comprises N-type conducting silicon, said metal flake comprises gold, and said impurity comprises indium.

6. The process of mass-producing semiconductor devices as defined in claim 4 wherein said semiconductor material comprises P-type conductivity silicon, said metal flake comprises silver, and said impurity comprises antimony.

7. A method of making a semiconductor device comprising applying a composition to the surface of a semiconductor body of a first conductivity type in the form of a dot, which composition comprises a portion of impurity of the opposite conductivity type mixed with equal amounts by weight of a binder consisting of 10 grams nitro cellulose dissolved in 400 cubic centimeters amyl acetate, said composition being applied to said surface by means of a rubber printing stamp coated with said composition and thereafter alloying said impurity into said body, thereby to form a P-N rectifying junction within said body.

References Cited in the file of this patent

UNITED STATES PATENTS

| | | |
|---|---|---|
| 2,701,326 | Pfann et al. | Feb. 1, 1955 |
| 2,877,147 | Thurmond | Mar. 10, 1959 |
| 2,879,188 | Strull | Mar. 24, 1959 |
| 2,923,870 | Zelinka | Feb. 2, 1960 |